United States Patent
Juengling

(10) Patent No.: US 7,326,606 B2
(45) Date of Patent: *Feb. 5, 2008

(54) SEMICONDUCTOR PROCESSING METHODS

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/678,513

(22) Filed: Oct. 3, 2003

(65) Prior Publication Data

US 2004/0067611 A1    Apr. 8, 2004

Related U.S. Application Data

(63) Continuation of application No. 10/128,933, filed on Apr. 23, 2002, now Pat. No. 6,635,558, which is a continuation of application No. 09/141,777, filed on Aug. 27, 1998, now Pat. No. 6,395,623.

(51) Int. Cl.
*H01L 21/8238*    (2006.01)

(52) U.S. Cl. ............ 438/199; 438/233; 438/533; 257/E21.577

(58) Field of Classification Search ........ 438/197–203, 438/233, 301–306, 514, 523, 524, 525, 533, 438/592, 595, 232, 548, 698, 701, 702–706, 438/142; 257/E21.575, E21.576, E21.577
See application file for complete search history.

(56) References Cited

U.S. PATENT DOCUMENTS

| | | | |
|---|---|---|---|
| 4,232,439 A | 11/1980 | Shibata | |
| 4,343,657 A | 8/1982 | Ito et al. | |
| 4,734,383 A | 3/1988 | Ikeda et al. | |
| 5,015,594 A | 5/1991 | Chu et al. | |
| 5,017,506 A | 5/1991 | Shen et al. | |
| 5,175,120 A | 12/1992 | Lee | 437/48 |
| 5,206,187 A | 4/1993 | Doan et al. | |

(Continued)

OTHER PUBLICATIONS

*Microchip Fabrication—Second Edition*, McGraw-Hill © 1990, p. 332 only.

(Continued)

*Primary Examiner*—Brook Kebede
(74) *Attorney, Agent, or Firm*—Wells St. John, P.S.

(57) ABSTRACT

In one aspect, the invention provides a method of forming a contact opening to a conductive line. In one preferred implementation, a contact opening is formed to a conductive line which overlies a substrate isolation area with an etch which also outwardly exposes substrate active area to accommodate source/drain doping. In another preferred implementation, desired PMOS regions over a substrate into which p-type impurity is to be provided are exposed while a contact opening is contemporaneously formed to at least one conductive line extending over substrate isolation oxide. In another preferred implementation, a contact opening to a conductive line over a substrate and an opening to a laterally spaced substrate active area are formed in a common masking step. In another preferred implementation, desired PMOS active areas over a substrate are exposed and p-type impurity to a first concentration is provided into desired exposed areas. A masking layer is formed over the substrate and subsequently patterned and etched to form openings over source/drain regions. P-type impurity is provided through the openings into the source/drain regions to a second concentration which is greater than the first concentration.

36 Claims, 5 Drawing Sheets

U.S. PATENT DOCUMENTS

| | | | | |
|---|---|---|---|---|
| 5,459,085 | A | 10/1995 | Pasen et al. | |
| 5,488,001 | A | 1/1996 | Brotherton | 999/21 |
| 5,631,182 | A | 5/1997 | Suwanai et al. | |
| 5,637,525 | A * | 6/1997 | Dennison | 438/232 |
| 5,656,520 | A | 8/1997 | Watanabe | |
| 5,668,065 | A | 9/1997 | Lin | |
| 5,686,324 | A | 11/1997 | Wang et al. | |
| 5,731,236 | A | 3/1998 | Chou et al. | |
| 5,731,242 | A | 3/1998 | Parat et al. | |
| 5,766,992 | A | 6/1998 | Chou et al. | |
| 5,780,333 | A | 7/1998 | Kim | 438/238 |
| 5,795,809 | A | 8/1998 | Gardner et al. | |
| 5,821,140 | A | 10/1998 | Jost et al. | |
| 5,856,227 | A | 1/1999 | Yu et al. | |
| 5,985,711 | A * | 11/1999 | Lim | 438/229 |
| 5,994,228 | A * | 11/1999 | Jeng et al. | 438/698 |
| 6,015,730 | A | 1/2000 | Wang et al. | |
| 6,025,255 | A | 2/2000 | Chen | |
| 6,027,971 | A | 2/2000 | Cho et al. | 438/257 |
| 6,037,222 | A | 3/2000 | Huang et al. | 438/257 |
| 6,093,629 | A | 7/2000 | Chen | |
| 6,165,880 | A | 12/2000 | Yaung et al. | |
| 6,177,339 | B1 | 1/2001 | Juengling | |
| 6,337,261 | B1 | 1/2002 | Juengling | |
| 6,395,623 | B1 * | 5/2002 | Juengling | 438/533 |
| 6,635,558 | B2 * | 10/2003 | Juengling | 438/533 |
| 6,949,430 | B2 | 9/2005 | Juengling | |

OTHER PUBLICATIONS

Wolf, Ph.D. et al., Silicon Processing for the VLSI Era—vol. 1—Process Technology, © 1986, p. 283 only.

* cited by examiner

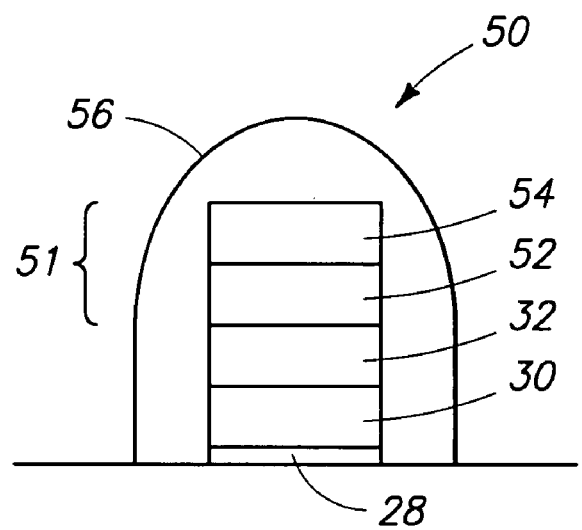
_FIG. 7_
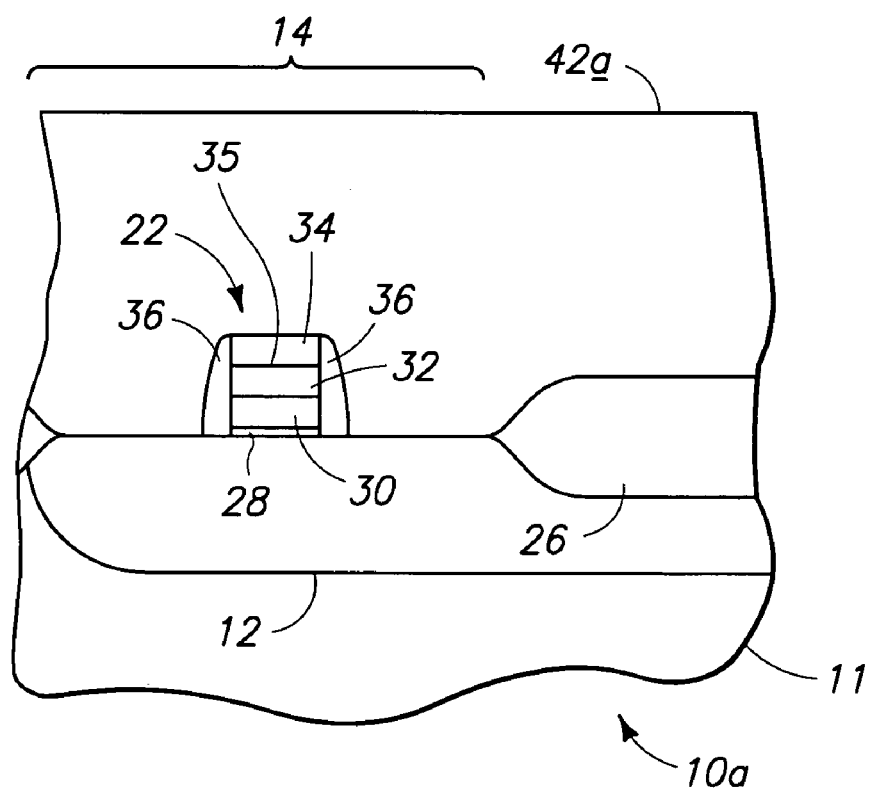
_FIG. 8_

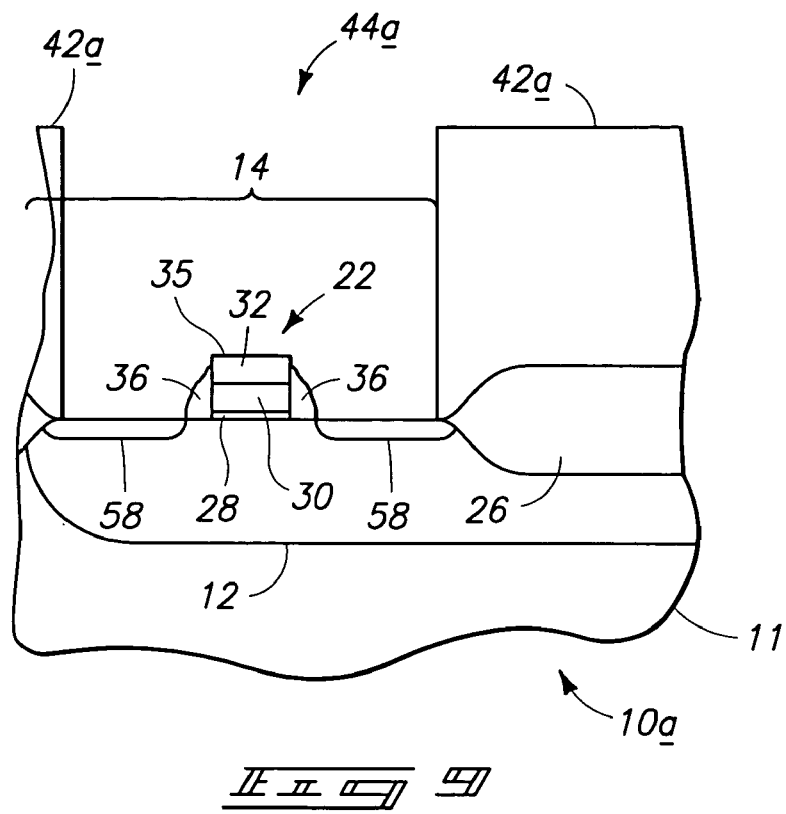
F I G 9
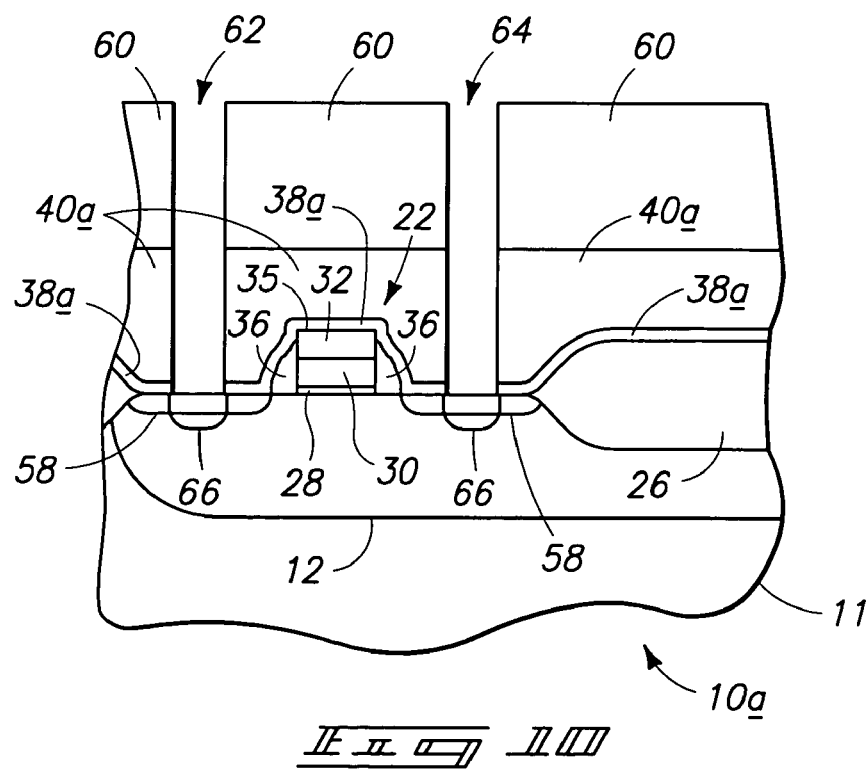
F I G 10

US 7,326,606 B2

SEMICONDUCTOR PROCESSING METHODS

CROSS REFERENCE TO RELATED APPLICATION

This patent application is a Continuation Application of U.S. patent application Ser. No. 10/128,933 filed Apr. 23, 2002, now U.S. Pat. No. 6,635,558 which issued Oct. 21, 2003, entitled "Semiconductor Processing Methods Of Forming A Contact Opening To A Conductive Line and Methods of Forming Substrate Active Area Source/Drain Regions," naming Werner Juengling as inventor, which is a Continuation Application of U.S. patent application Ser. No. 09/141,777 filed Aug. 27, 1998, now U.S. Pat. No. 6,395,623 B1 which issued May 28, 2002, the disclosures of which are hereby incorporated herein by reference.

TECHNICAL FIELD

This invention relates to semiconductor processing methods of forming integrated circuitry and in particular, to methods of forming complementary metal oxide semiconductor (CMOS) circuitry. The invention also relates to semiconductor processing methods of forming a contact opening to a conductive line.

BACKGROUND OF THE INVENTION

High density integrated circuitry is principally fabricated from semiconductor wafers. An MOS (metal-oxide-semiconductor) structure in semiconductor processing is created by superimposing several layers of conducting, insulating and transistor forming materials. After a series of processing steps, a typical structure might comprise levels of diffusion, polysilicon and metal that are separated by insulating layers. Upon fabrication completion, a wafer contains a plurality of identical discrete die areas which are ultimately cut from the wafer to form individual chips. Die areas or cut dies are tested for operability, with good dies being assembled into separate encapsulating packages which are used in end-products or systems.

CMOS is so-named because it uses two types of transistors, namely an n-type transistor (NMOS) and a p-type transistor (PMOS). These are fabricated in a semiconductor substrate, typically silicon, by using either negatively doped silicon that is rich in electrons or positively doped silicon that is rich in holes. Different dopant ions are utilized for doping the desired substrate regions with the desired concentration of produced holes or electrons.

NMOS remained the dominant MOS technology as long as the integration level devices on a chip was sufficiently low. It is comparatively inexpensive to fabricate, very functionally dense, and faster than PMOS. With the dawning of large scale integration, however, power consumption in NMOS circuits began to exceed tolerable limits. CMOS represented a lower-power technology capable of exploiting large scale integration fabrication techniques.

Fabrication of semiconductor circuitry includes numerous processing steps in which certain areas of a semiconductor substrate are masked while other areas are subjected to processing conditions such as various etching steps and doping steps. In an effort to optimize semiconductor processing, efforts in the industry have been focused on reducing the number of processing steps in any particular processing flow. Reducing the number of processing steps required in a particular processing flow saves valuable processing time and subjects the wafer to less risk of destruction.

In typical CMOS processing, separate photomasking processing steps are utilized to both open up contact openings to conductive lines formed over the substrate, as well as to expose substrate active areas into which dopants or conductivity changing impurity were to be added. Such separate processing of course adds to processing time and effort. It is desirable to reduce the number of required processing steps associated with forming integrated circuitry. It is also desirable to improve upon current semiconductor processing techniques.

This invention arose out of concerns associated with reducing the number of processing steps required to produce integrated circuitry in particular CMOS circuitry. This invention also grew out of concerns associated with improving formation of PMOS active area diffusion regions associated with CMOS circuitry.

SUMMARY OF THE INVENTION

In one aspect, the invention provides a method of forming a contact opening to a conductive line. In one preferred implementation, an etch is conducted to form a contact opening to a conductive line which overlies a substrate isolation area. The same etch also, preferably, outwardly exposes substrate active area to accommodate source/drain doping. In another preferred implementation, desired PMOS regions over a substrate into which p-type impurity is to be provided are exposed while a contact opening is contemporaneously formed to at least one conductive line extending over substrate isolation oxide. In another preferred implementation, a contact opening to a conductive line over a substrate and an opening to a laterally spaced substrate active area are formed in a common masking step.

In another preferred implementation, desired PMOS active areas over a substrate are exposed and p-type impurity to a first concentration is provided into desired exposed areas. Such preferably defines at least a portion of source/drain regions to be formed. A masking layer is formed over the substrate and subsequently patterned and etched to form openings over desired source/drain regions. P-type impurity is then provided through the openings and into the source/drain regions to a second concentration which is greater than the first concentration.

BRIEF DESCRIPTION OF THE DRAWINGS

Preferred embodiments of the invention are described below with reference to the following accompanying drawings.

FIG. 7 is a cross-sectional view of an alternate conductive line construction made in accordance with the invention.

FIG. 8 is a cross-sectional view of the FIG. 1 semiconductor wafer fragment at an alternate processing step subsequent to that shown in FIG. 3.

FIG. 9 is a cross-sectional view of the FIG. 8 semiconductor wafer fragment at a processing step subsequent to that shown by FIG. 8.

FIG. 10 is a cross-sectional view of the FIG. 8 semiconductor wafer fragment at a processing step subsequent to that shown by FIG. 9.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
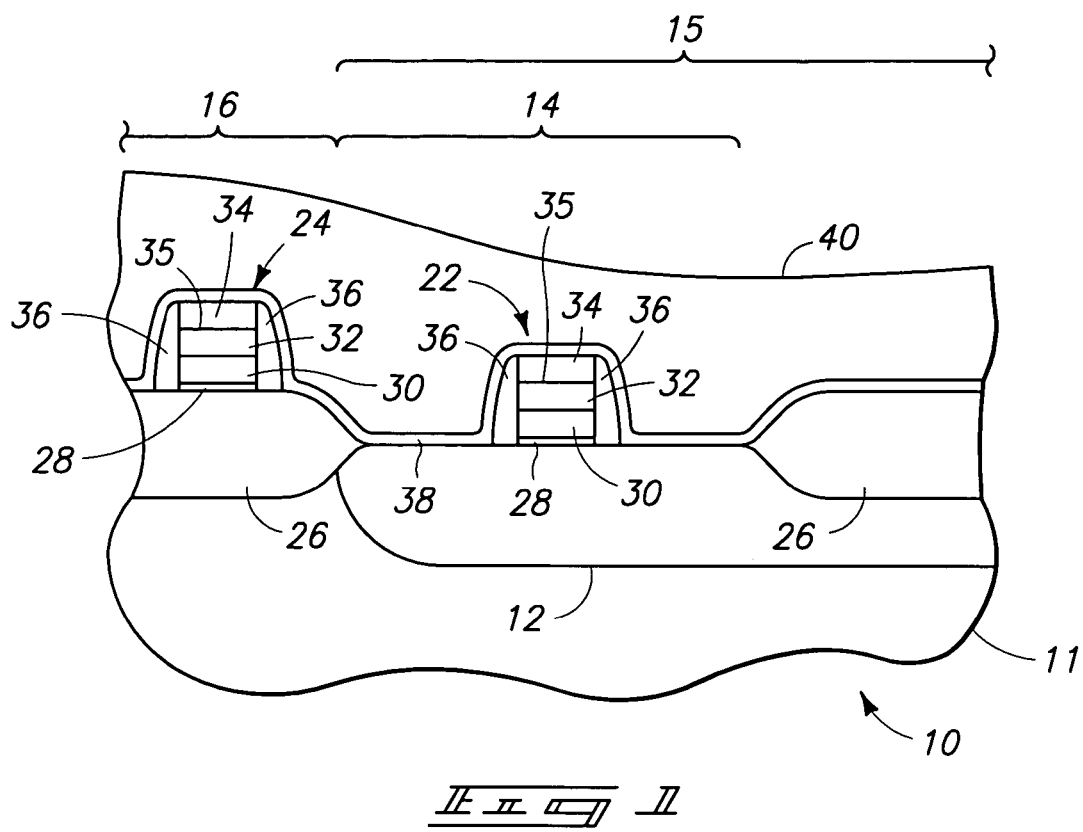
FIG. 1 is a cross-sectional view of a semiconductor wafer fragment at one processing step in accordance with the invention.

Referring to FIG. 1, a semiconductive substrate in process is indicated generally with reference numeral 10. Preferably, such is comprised of a bulk monocrystalline silicon substrate 11 having various layers deposited or otherwise formed thereover. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Semiconductive substrate 10, in the illustrated and preferred embodiments is undergoing processing in which CMOS circuitry is formed. Accordingly, an n-well 12 is provided within substrate 11 for supporting the formation of PMOS circuitry and comprises PMOS active area region 14 within PMOS region 15. Corresponding NMOS circuitry is depicted by reference numeral 16 and comprises a conductive line 24 in the illustrated cross section. Line 24 is operatively connected to corresponding NMOS active area regions which are not specifically shown.

Typically, active area regions such as PMOS active area region 14 include at least one conductive line 22 which extends thereover and provides a gate line stack for MOS transistors to be subsequently formed. According to one aspect of the invention, lines 22 and 24 comprise conductive gate or word lines which overlie one or more field isolation regions, areas or field oxide regions such as regions or areas 26 which extend into and out of the page. Other conductive lines, and ones which do not necessarily extend over the to-be-described PMOS and NMOS active areas can undergo processing in accordance with the invention, as will become apparent below.

In accordance with one preferred methodical aspect of the invention, desired PMOS active area regions 14 are exposed over semiconductive substrate 10 while a contact opening to at least one conductive line is formed: Preferably, the PMOS region is exposed and the contact opening is formed using a common masking step. This is advantageous because at least one masking step can be eliminated in the process flow.

Conductive line 22 includes a gate oxide layer 28 atop which a polysilicon layer 30, a silicide layer 32 and a protective nitride containing cap or capping layer 34 are formed. Sidewall spacers 36 are preferably formed from a suitable nitride material and overlie sidewalls of the gate line. Together, nitride cap 34 and sidewall spacers 36 form a protective nitride encapsulation layer over conductive gate line 22. Conductive line 24 is preferably formed contemporaneously with conductive line 22. Accordingly, it as well comprises gate oxide layer 28, polysilicon layer 30, silicide layer 32, protective nitride containing cap or capping layer 34 and protective sidewall spacers 36. As with conductive line 22, nitride containing cap or capping layer 34 together with sidewall spacers 36 form a protective nitride encapsulation layer over conductive line 24. For purposes of ongoing discussion, conductive lines 22, 24 comprise a plurality of layers which were previously formed over semiconductive substrate 10, and subsequently etched to form or produce the conductive lines. The illustrated and preferred conductive lines have respective conductive line tops 35 over which the protective nitride material 34 is formed.

Referring still to FIG. 1, a thin layer of oxide 38 is formed preferably through decomposition of tetraethylorthosilicate (TEOS). An oxide layer 40, preferably borophosphosilicate glass (BPSG), is formed thereover.

Figure 2:
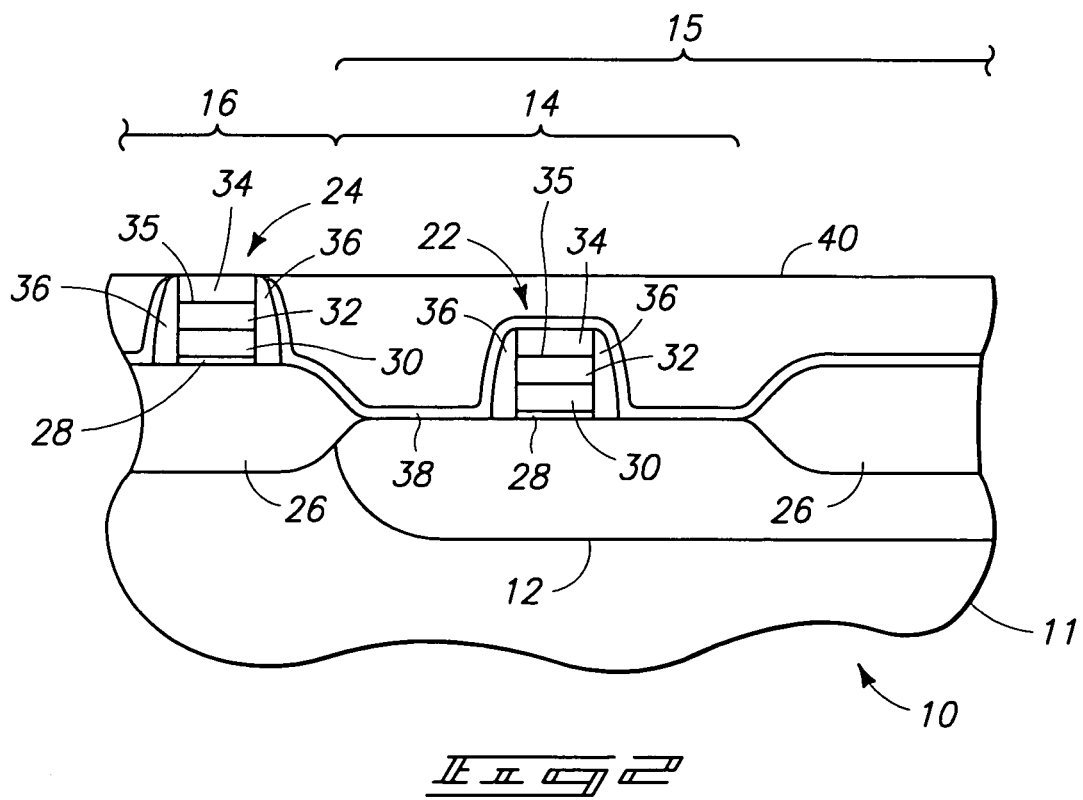
FIG. 2 is a cross-sectional view of the FIG. 1 semiconductor wafer fragment at a processing step subsequent to that shown by FIG. 1.

Referring to FIG. 2, layer 40 is planarized, as by suitable mechanical abrasion of semiconductive substrate 10. An example mechanical abrasion process is chemical-mechanical planarization. Other planarization techniques are of course possible.

Figure 3:
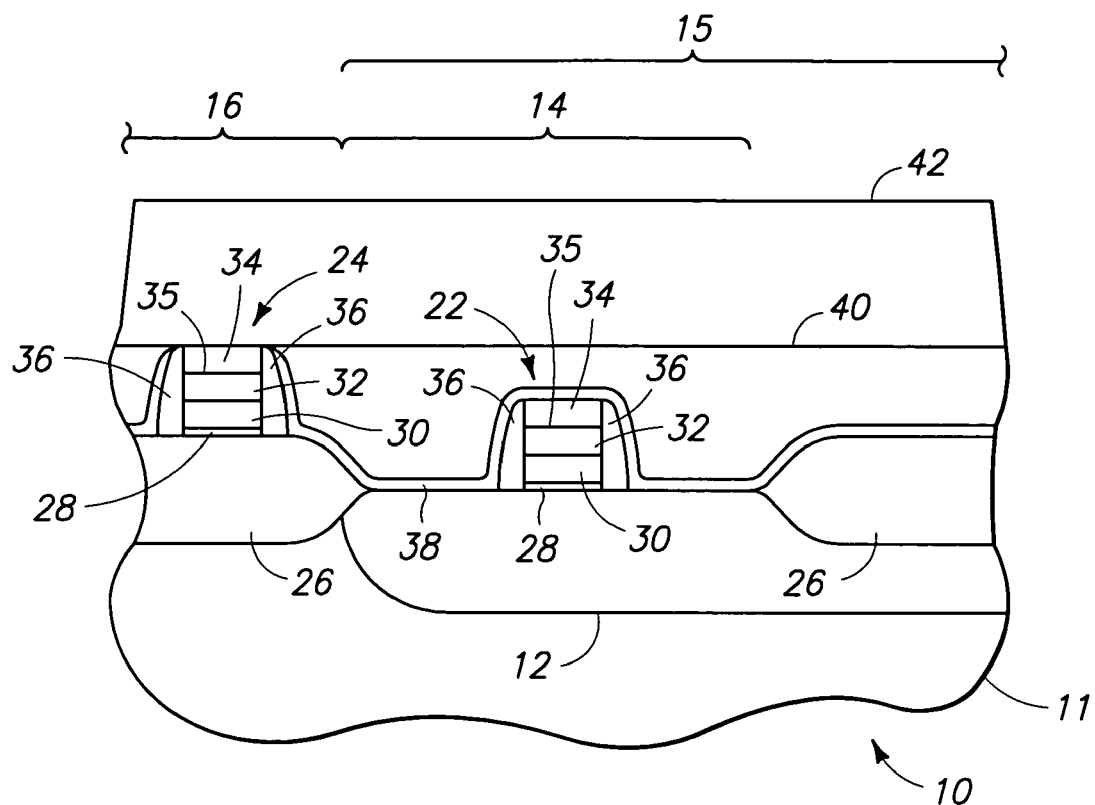
FIG. 3 is a cross-sectional view of the FIG. 1 semiconductor wafer fragment at a processing step subsequent to that shown by FIG. 2.
Figure 4:
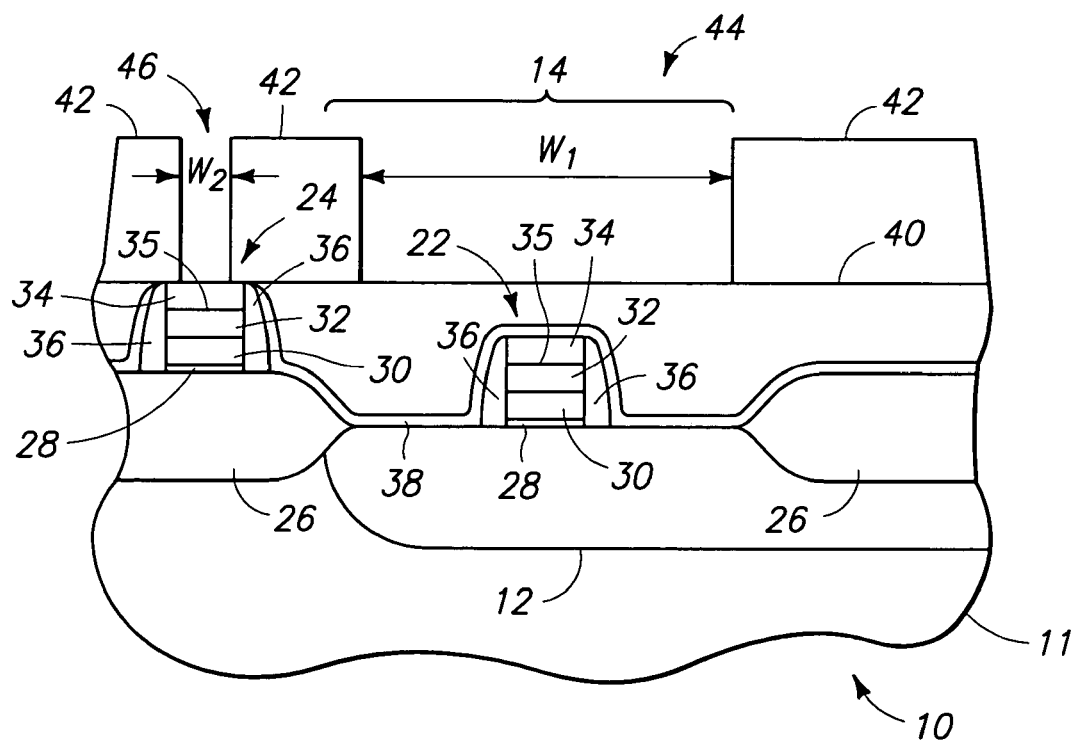
FIG. 4 is a cross-sectional view of the FIG. 1 semiconductor wafer fragment at a processing step subsequent to that shown by FIG. 3.

Referring to FIGS. 3 and 4, a layer of photoresist 42 is formed over semiconductive substrate 10 (FIG. 3) and subsequently patterned (FIG. 4) to form or define a doping window 44 over PMOS active region 14, and an opening 46 over conductive line 24. In the illustrated and preferred embodiment, doping window 44 has a first open lateral width dimension $W_1$ and opening 46 has a second open lateral width dimension $W_2$. Second open lateral width dimension $W_2$ is less than the first open lateral width dimension $W_1$.

Figure 5:
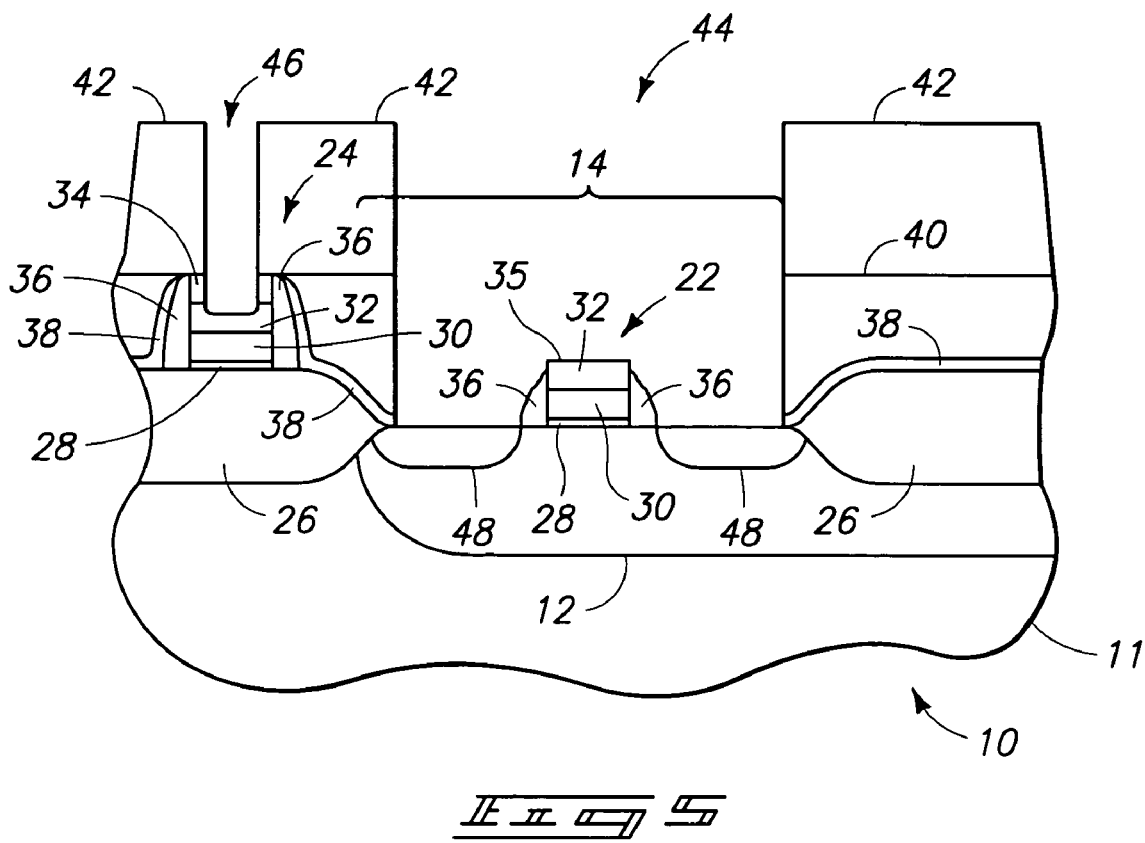
FIG. 5 is a cross-sectional view of the FIG. 1 semiconductor wafer fragment at a processing step subsequent to that shown by FIG. 4.

Referring to FIG. 5, and in the illustrated common masking step, oxide layers 40 and 38 are etched downwardly to outwardly expose PMOS active area region 14, and more specifically, to expose PMOS active areas into which p-type impurity is to be provided. In the same step, contact opening 46 is formed or etched over conductive line 24 overlying the field isolation region 26. As shown, the etch forming contact opening 46 will typically remove at least some of the nitride material forming nitride cap 34 and hence outwardly expose a portion of silicide layer 32 thereunder. Accordingly, the etch also removes the nitride cap over conductive gate line 22 and etches spacers 36 downwardly as shown. At this point, enough of the oxide layer over the substrate active area has typically been removed to outwardly expose desired source/drain regions and accommodate doping of the source/drain regions with p-type impurity adjacent gate line 24.

According to one aspect of the invention, the contact opening is formed and the substrate active area is exposed utilizing one anisotropic etch which preferably etches oxide material and nitride material at substantially the same rate. Alternately, two separate etches can be used to expose the substrate active area. An exemplary etch can be a first anisotropic dry etch followed by a wet etch. Other etching regimes are of course possible.

Referring still to FIG. 5, and at a processing point where the illustrated patterned photoresist is still in place over the substrate, p-type impurity is provided into the substrate to form diffusion regions 48. As provided, diffusion regions 48 define at least portions of desired doped source/drain regions. Suitable p-type dopants include boron, $BF_2$, and the like. Such doping of regions 48 can be carried out, for example, by ion implantation. One preferred method is angled ion doping at some significant angle from vertical (i.e. between about 0° and 45°), with substrate 10 being rotated during such doping. Other angles are possible. Such angled ion doping results in little, if any, dopant reaching the exposed portion of conductive line 24. This is because the lateral width of doping window 44 provides a much larger target area than the relatively narrow lateral width of the contact opening 46 over conductive line 24.

Figure 6:
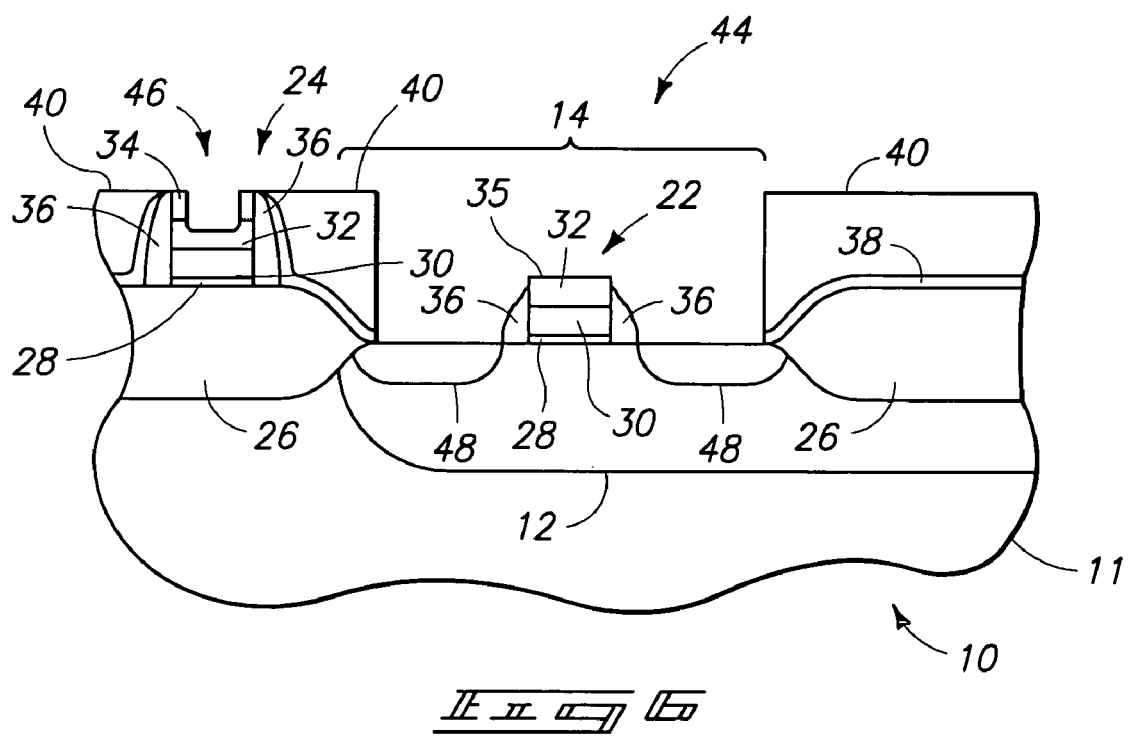
FIG. 6 is a cross-sectional view of the FIG. 1 semiconductor wafer fragment at a processing step subsequent to that shown by FIG. 5.

Alternately and more preferred, the patterned photoresist 42 is stripped as shown in FIG. 6 prior to forming diffusion regions 48. A preferred doping technique in such instance is gas chemical diffusion. One advantage of gas chemical diffusion over the above described ion implantation is the formation of shallower junctions having heavier surface doping. Shallower junctions are advantageous because less lateral diffusion occurs during downstream heat processing of the substrate. Heavier surface doping is advantageous because such desirably reduces contact resistance when contacts are subsequently formed or made to such regions. Accordingly, such provides an example of forming PMOS source/drain regions over semiconductive substrate 10 in the absence of any photoresist over NMOS regions of the substrate. Such can however result in provision of PMOS dopant within a portion of the lateral width of line 24 and particularly silicide layer 32. Any conductivity change resulting from the introduction of dopant into silicide layer 32 is, to a desirable extent, mitigated by the narrower width of opening 46 as compared to the lateral width of line 24 itself. Accordingly, circuit operability is maintained.

Alternately, processing the substrate in accordance with the above-described approach could also be used to effect formation of NMOS source/drain regions over a substrate in the absence of any photoresist over PMOS regions of the substrate.

Referring to FIG. 7, an alternate conductive line and/or gate stack 50 is shown. Such construction can be used to mitigate the above-described etch into silicide layer 32 of conductive line 24 (FIGS. 5 and 6) when the doping window and contact opening 46 are formed. In the figure, like elements have been similarly designated. Accordingly, line 50 comprises a conductive portion atop a gate oxide layer 28. The conductive portion comprises polysilicon layer 30 and silicide layer 32 thereatop. Line 50 also includes a protective portion or capping layer 51 formed over the conductive portion. According to a preferred aspect of the invention, the protective portion includes a nitride layer 52 deposited to a thickness of around 300 Angstroms, and an oxide layer 54 elevationally outwardly of and atop the nitride layer. Layer 54 can be provided by suitable decomposition of TEOS, with an example thickness for layer 54 being around 200 to 600 Angstroms. A nitride encapsulation material 56 is subsequently provided or formed over the conductive line. Hence when contact opening 46 is formed as described above, at least some of the nitride encapsulation material 56 and some of the protective portion, including upper oxide portion 54 are removed. Preferably, such removed portions leave behind enough of nitride layer 52 to provide a protective cap or cover over the conductive line. One manner of forming contact opening 46 which capitalizes on such alternate conductive line is to first etch or otherwise remove a portion of nitride encapsulation material 56 substantially selective to oxide portion 54, and then to remove at least a portion of oxide portion 54 substantially selective to nitride layer 52. Such leaves at least some of nitride layer 52 over silicide layer 32 which desirably shields the underlying conductive portion of line 50 during the p-type doping described above.

The above described methodology enables contemporaneous formation of a contact opening to at least one conductive line and exposure of desired substrate active regions or areas into which dopants or impurities are to be provided. According to a preferred aspect of the invention, the desired substrate active areas comprise PMOS active areas which form part of a CMOS integrated circuit. According to another preferred aspect of the invention, the contact opening is formed to a conductive line which includes a portion which extends over substrate active area and which provides a conductive gate or word line thereto. In one implementation, such conductive line overlies a field isolation region and extends laterally away therefrom and over a substrate active area. Such process represents an improvement over previous processes in at least the following ways. First, a masking step can be eliminated. Second, a heavier p-type doping step is conducted much later in the processing flow which minimizes undesired thermally-effected diffusion of p+ regions, as such are not subjected to as much thermal processing as if such were formed earlier in the process. Third, gas phase doping can take place to form desired substrate diffusion regions instead of the above-described ion implantation.

Referring to FIGS. 8-10, a process methodology is described which is advantageous in that such lowers contact resistance for subsequently formed contacts to p+ diffusion regions. Like numbers from the first described embodiment are utilized where appropriate, with differences being indicated with the suffix "a" or with different numerals. Such process provides a better "off" state for PMOS transistors by minimizing lateral spread of the high concentration of the p+ material in PMOS source/drains. Such greatly reduces the risk of current leakage beneath the gates in channel regions.

Semiconductive substrate 10a is shown in FIG. 8 at a processing step before layers 38 and 40 are deposited in FIG. 3. A photoresist layer 42a is formed over substrate 10a.

Referring to FIG. 9, photoresist layer 42a is suitably patterned to define a doping window 44a over PMOS active area 14 and not the above described contact opening 46 (FIG. 4). P-type impurity is provided into exposed substrate source/drain active area regions to a first concentration. A suitable concentration of p-type impurity is between about $1\times10^{18}$ cm$^{-3}$ and $1\times10^{20}$ cm$^{-3}$. Such defines p-type diffusion first regions 58. Thereafter, photoresist layer 42a is removed and layers 38a and 40a can be deposited and planarized as in FIG. 3.

Referring to FIG. 10, a masking layer 60 is formed over the substrate and subsequently layers 40a and 38a are patterned and etched to form openings 62, 64 over diffusion first regions 58. Such etch may advantageously be the same etch which opens up contact opening 46 (FIG. 4) to conductive line 24. Openings 62, 64 are smaller in cross-section than the diffusion regions over which such are formed. P-type impurity is then provided through openings 62, 64 to a second concentration which is greater than the first concentration. An exemplary concentration of p-type impurity is between $1\times10^{20}$ cm$^{-3}$ and $5\times10^{20}$ cm$^{-3}$. Such forms p-type diffusion second regions 66 which constitute at least a portion of the source/drain regions. The remainder of the processing to form the desired circuitry can take place in accordance with practices understood and appreciated by those of skill in the art.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor processing method comprising:
   forming a conductive word line over at least a portion of a substrate active area, the word line having a conductive top;
   forming nitride material over the conductive top of the word line;
   forming sidewall spacers laterally adjacent to the word line, the sidewall spacers comprising a nitride;
   forming an oxide material over the conductive word line and the substrate active area; and
   etching the oxide material, the nitride material and the sidewall spacers at substantially the same rate, the etching outwardly exposing at least one portion of the substrate active area into which p-type impurity is to be provided, the etching also forming a contact opening over a portion of the conductive word line which overlies a field isolation region.

2. The method of claim 1 further comprising doping the at least one portion of the substrate active area by ion implantation.

3. The method of claim 1 further comprising doping the at least one portion of the substrate active area by gas chemical diffusion.

4. The method of claim 1, wherein the etching defines a doping window through which the at least one portion of the substrate active area is exposed, the doping window having a greater lateral width dimension than the contact opening.

5. The method of claim 1, wherein the etching defines a doping window through which the at least one portion of the substrate active area is exposed, the doping window having a greater lateral width dimension than the contact opening and further comprising angle doping the exposed at least one portion of the substrate active area to form source/drain regions.

6. A semiconductor processing method comprising:
   forming at least one conductive gate line comprising silicide over a substrate and extending over a substrate active area;
   forming a nitride material over the silicide material;
   forming oxide material over the at least one conductive gate line and the substrate active area; and
   etching to remove portions of the nitride material over the conductive gate line to form a contact opening thereto and to remove portions of the oxide material over the substrate active area to expose source/drain regions into which p-type impurity is to be provided, the etching removing the nitride material and the oxide material at substantially the same rate.

7. The method of claim 6, wherein the etching defines a doping window through which the substrate active area is exposed, the doping window having a greater lateral width dimension than the contact opening.

8. The method of claim 6, wherein the etching defines a doping window through which the substrate active area is exposed, the doping window having a greater lateral width dimension than the contact opening and further comprising angle doping the exposed substrate active area to form the source/drain regions.

9. A semiconductor processing method comprising:
   forming a conductive line over a substrate, the conductive line having a conductive portion and silicon nitride material over the conductive portion, and silicon oxide material over the silicon nitride material;
   forming encapsulation material over the conductive line; and
   in a common masking step and a common etching step, etching to form a doping window opening over a substrate active area adjacent the conductive line and removing at least some of the encapsulation material over the conductive line and removing some of the silicon nitride material over the conductive portion of the conductive line to form a contact opening to the conductive line.

10. The method of claim 9 further comprising gas diffusion doping through the doping window opening into the substrate active area with a p-type impurity.

11. A semiconductor processing method comprising:
   forming a conductive word line over a substrate;
   forming a silicon nitride layer over the word line;
   forming a silicon oxide layer over the silicon nitride layer;
   forming encapsulation material over the silicon oxide layer, the silicon nitride layer and the conductive word line, the encapsulation material forming sidewall spacers adjacent the conductive word line;
   selectively removing at least some of the encapsulation material relative to the silicon oxide layer; and
   selectively removing at least some of the silicon oxide layer relative to the silicon nitride layer wherein the selectively removing forms at least part of a contact opening over the word line.

12. A semiconductor PMOS processing method comprising:
   forming at least one conductive gate line having a conductive line top;
   forming a nitride material over at least a portion of the conductive line top;
   forming oxide material over the nitride material;
   forming photoresist material over the oxide material;
   in a common masking step, patterning the photoresist material to form a contact opening pattern configured for forming a contact opening over the conductive gate line and a doping window pattern over an active area of the substrate adjacent the conductive gate line, the contact opening pattern and the doping window pattern having respective lateral width dimensions, the contact opening pattern lateral width dimension being less than the doping window pattern lateral width dimension;
   anisotropically etching both the nitride material and the oxide material at substantially the same rate to respectively define the contact opening to the conductive gate line and the doping window over the substrate active area adjacent the gate line; and
   doping selected areas of the substrate active area with a p-type impurity to form at least a portion of one source/drain region.

13. The method of claim 12 further comprising forming NMOS circuitry over the substrate, the PMOS circuitry and the NMOS circuitry collectively defining CMOS circuitry.

14. A semiconductor processing method comprising:
   forming at least one conductive gate line at least partially overlying a field isolation region and having a conductive line top;
   forming a nitride material over at least a portion of the conductive line top;
   forming an oxide material over the nitride material; and using a common mask, etching both the nitride material and the oxide material at substantially the same rate to respectively form a contact opening over the conductive gate line and a doping window over an active area of a substrate adjacent the conductive gate line, wherein the common mask comprises contact opening pattern width dimension less than a doping window pattern width dimension.

15. The method of claim 14 further comprising doping through the doping window into the active area of the substrate by ion implantation.

16. The method of claim 14 further comprising doping through the doping window into the active area of the substrate by gas chemical diffusion.

17. The method of claim 9, wherein the etching to form the doping window opening comprises forming a pair of doping window openings adjacent opposite sides of the conductive line.

18. The method of claim 9, wherein the etching comprises exposing the conductive portion of the conductive line.

19. The method of claim 9, wherein the encapsulation material comprises nitride material.

20. The method of claim 9, wherein the encapsulation material comprises material other than oxide material.

21. The method of claim 9, wherein the forming of the encapsulation material comprises forming after the forming of the conductive line.

22. The method of claim 9, wherein the encapsulation material and the silicon oxide material comprise different materials.

23. The method of claim 11, wherein the encapsulation material comprises nitride material.

24. The method of claim 11, wherein the forming of the encapsulation material comprises forming a substantial portion of the encapsulation material elevationally below the silicon oxide layer.

25. The method of claim 9, wherein the encapsulation material and the silicon oxide material are separate and distinct materials.

26. The method of claim 9, wherein the forming of the conductive line having the silicon oxide material comprises a first forming step, and wherein the forming of the encapsulation material comprises a second forming step which is distinct and separate from the first forming step.

27. The method of claim 9, wherein the forming of the conductive line having the silicon oxide material comprises a forming step performed in a first time period, and wherein the forming of the encapsulation material comprises a forming step performed in a second time period which is different from the first time period.

28. The method of claim 9, wherein the forming of the conductive line having the silicon oxide material comprises a forming step that is entirely completed before the forming of the encapsulation material.

29. The method of claim 11, wherein the conductive word line comprises conductive portions, and wherein the forming of the encapsulation material comprises forming nitride material contacting the conductive portions of the conductive word line.

30. The method of claim 11, wherein the conductive word line comprises sidewalls, and wherein the forming of the encapsulation material comprises forming nitride material contacting the sidewalls of the conductive word line.

31. The method of claim 11, wherein the forming of the encapsulation material comprises forming the encapsulation material contacting the substrate.

32. The method of claim 9, wherein the doping window opening is discrete and separate from the contact opening.

33. The method of claim 9, wherein the common etching step comprises one anisotropic etch.

34. The method of claim 9, wherein the common etching step comprises using the same etch chemistry.

35. The method of claim 9, wherein the forming of the conductive line comprises patterning the silicon oxide material substantially the same as the silicon nitride layer.

36. The method of claim 9, wherein the forming of the conductive line comprises patterning the silicon oxide material substantially the same as the conductive portion.

* * * * *